Nov. 14, 1967 M. VAN WILSON 3,353,111

AMPLIFIER CIRCUITS FOR DIFFERENTIAL AMPLIFIERS

Filed April 1, 1963 3 Sheets-Sheet 1

INVENTOR.
MARLIN V. WILSON
BY Michael A. Sileo Jr.
AGENT

Nov. 14, 1967 M. VAN WILSON 3,353,111

AMPLIFIER CIRCUITS FOR DIFFERENTIAL AMPLIFIERS

Filed April 1, 1963 3 Sheets-Sheet 2

INVENTOR.
MARLIN V. WILSON

BY *Michael A. Sileo Jr.*

AGENT

Nov. 14, 1967 M. VAN WILSON 3,353,111

AMPLIFIER CIRCUITS FOR DIFFERENTIAL AMPLIFIERS

Filed April 1, 1963 3 Sheets-Sheet 3

INVENTOR
MARLIN V. WILSON

BY Michael A. Siler Jr.

AGENT 3,353,111
Patented Nov. 14, 1967

3,353,111

AMPLIFIER CIRCUITS FOR DIFFERENTIAL AMPLIFIERS

Marlin Van Wilson, Orange County, Fla., assignor to Martin-Marietta Corporation, Middle River, Md., a corporation of Maryland Filed Apr. 1, 1963, Ser. No. 269,424
10 Claims. (Cl. 330—69)

This invention relates to a differential amplifier circuit which is capable of reducing the overall common mode gain of the circuit to a low value and causing the common mode components of the output voltages of the circuit to be at a predetermined voltage level, and more particularly to a differential amplifier circuit that deliberately allows any common mode voltags present in the circuit to be amplified, and then utilized to develop a feedback voltage which is negative with respect to such common mode voltages so as to effectively cancel such common mode voltage in order to reduce the overall common mode gain of the circuit.

For purposes of this description, the voltage which is common to the two input voltages supplied respectively to the two input terminals of the differential amplifier circuit shall be referred to as the "common mode" voltage, and the voltage difference between the input voltages applied to the two input terminals shall be referred to as the "differential mode" voltage.

The differential amplifier has been primarily used in applications where it is desirable to achieve stabilized output voltages which are accurately indicative of the voltage difference between the two applied input voltages notwithstanding wide common mode voltage variations of the input voltages.

It is highly essential, therefore, that the differential amplifier circuit either reject unwanted common mode voltages, which are either superimposed upon the input voltages or developed by circuit components and operation, or dynamically compensate for the effect of such voltages upon the overall output of the circuit, so that accurate indications of very slight amplitude differences of the input voltages can be obtained. In addition, the differential amplifier circuit should provide high stability, low differential and common mode voltage drifts, and high differential mode voltage gain. It is accordingly desirable that circuits of this type greatly amplify the differential voltages yet minimize the effect of the common mode voltages on the overall output of the circuit.

The prior art is replete with various types of diffierential amplifier circuits for accurately indicating the voltage differences between two input voltages. However, the prior known techniques for achieving the aforementioned desirable features have required comparatively complex and elaborate circuit components external to the differential amplifier circuit, such as chopper switches, chopper amplifiers, bridge networks, memory devices, etc. That is to say, these prior techniques utilize circuit components in one form or another in a circiut arrangement external to the basic differential amplifier circuit.

One prior known technique addresses the common mode voltage drift problem by reducing the common mode voltage gain of the differential amplifier. Such technique utilizes cathode followers driven by two input voltages to cause the cathode supply voltage to vary. With this arrangement, although the cathode follower input stages introduces very small losses in the overall gain of the amplifier, no stabilizing effect on the common mode output voltages during power supply or ambient temperature variations is obtainable.

Another prior known technique attempts to alleviate the common mode voltage drift of the differential amplifier by reducing the single-ended drift thereof. Such technique utilizes a chopper amplifier connected external to the basic circuit for developing a control signal to activate apparatus which controls the gain of the differential amplifier. A chopper amplifier is deemed desirable in circuits of this type since it is not responsive to common mode voltages at the input of the amplifier, and hence the control signal developed by the chopper amplifier is not affected by the common mode voltages. This prior art technique is not completely satisfactory, however, since it requires comparatively complex external circuitry.

Another known technique attempts to compensate for common mode voltage drifts by utilizing a double-pole double-throw chopper switch to sample the output voltages. The sampled voltages are then stored on a capacitor so that when the chopper switch moves to its opposite position, the stored voltages may be compared with the input voltages. Then, any differences between the stored voltages and the input voltages may be appropriately applied to the amplifier as a drift correction. Although this latter technique is satisfactory in many respects, and a chopper switch is less expensive then a chopper amplifier, it also requires comparatively elaborate and complex external circuitry.

The foregoing problems and undesirable features inherent in the prior known differential amplifier circuits are uniquely overcome by the direct coupled, multistage, balanced differential amplifier of the present invention by virtue of the advantageous utilization of a highly amplified common mode voltage in a negative feedback arrangement and the comparison of such neagtive feedback voltage with a reference voltage.

In one exemplary embodiment of the present invention, a differential and common mode amplifier (DCMA) is primarily provided for amplifying the differential voltages applied to the differential amplifier circuit. This DCMA is specially designed to also amplify any common mode voltages superimposed on the two input voltages or developed by the basic circuit and to provide high negative common mode gain, yet retain the low differential voltage drift characteristic inherent in differential amplifiers.

The development of a high gain common mode voltage in differential amplifier circuits has been heretofore deemed to be a highly undesirable characteristic and skilled artisans have, in view of this premise, utilized every means available to reduce the common mode gain characteristics of circuits of this type. The present invention, with purposeful design, enhances the common mode voltage gain characteristics of the DCMA and advantageously utilizes this highly amplified common mode voltage in a negative feedback arrangement so as to uniquely compensate and eliminate common mode voltage drift problems.

That is to say, it is not necessary in accordance with this invention to utilize complex and elaborate internal or external components to reduce the common mode voltage amplification of the basic circuit.

In order to achieve high differential mode voltage gain, overall low common mode voltage gain, low differential mode voltage drift, and yet provide low common mode voltage drift, the two output voltages of the DCMA are in accordance with this first embodiment of the invention, simultaneously delivered to a common mode filter (CMF), which passes only the highly amplified common mode voltage of the two output voltages, for developing a negative common mode feedback voltage. The common mode feedback voltage passed by the CMF is then applied to a comparator wherein it is compared with a reference voltage for developing a common mode error voltage. This error voltage is then simultaneously applied to one input of each of two dual-input algebraic summation networks (ASN), whereas, the two input voltages, which are to be differentially amplified, are respectively applied to the other ASN inputs. Thus, the ASN outputs will respectively represent the algebraic summation of one of the input voltages applied to the differential amplifier circuit with the negative common mode error voltage developed by the CMF and comparator. The ASN outputs or summation voltages are then respectively coupled to the two inputs of the DCMA. Accordingly, the summation voltages will uniquely compensate for any unwanted common mode voltage superimposed on the input voltages delivered to the circuit or any unwanted common mode voltages developed by the circuit itself.

In another exemplary embodiment of the present invention, a differential and common mode amplifier and comparator (DCMAC) is primarily provided for amplifying the differential mode voltages applied to the differential amplifier circuit, and, at the same time, for comparing a highly amplified negative common mode feedback volttage with a reference voltage. The DCMAC is specially designed to also amplify any common mode voltages superimposed on the two input voltages or developed by any circuit component, and to provide a high common mode gain yet retain the inherent low different mode gain yet retain the inherent low differential mode voltage drift characteristics of conventional balanced differential circuits. Again, no attempt is made nor means provided for reducing the common mode voltage gain characteristics of the basic circuit.

In order to achieve high differential mode voltage gain, overall low common mode voltage gain, low differential mode voltage drift, and yet provide low common mode voltage drift, the two outputs of the DCMAC are simultaneously delivered to a common mode filter (CMF), which passes only the common mode voltage of the two output voltages, for developing a negative common mode feedback voltage. This common mode feedback voltage is then simultaneously applied to one input of each of two dual-input algebraic summation networks (ASN), whereas, the two input voltages, which are to be differentially amplified, are respectively applied to the other ASN inputs. Thus, the ASN outputs will respectively represent the algebraic summation of one of the input voltages applied to the differential circuit and the negative common mode feedback voltage passed by the CMF. One of the ASN output voltages is fed to one input of the DCMAC and the other ASN output voltage is fed to the other DCMAC input, and a reference voltage is applied in common to the input circuits of the DCMAC. The DCMAC then compares the ASN output voltages with the reference voltage so as to generate a common mode error voltage, and amplifies not only the error voltage but the differential and common mode input voltages as well. As will be described more fully below, the two ASN output voltages or summation voltages will uniquely compensate for any unwanted common mode voltages present either at the input or the output of the differential amplifier circuit.

It will be apparent, in view of the foregoing exemplary embodiments of the present invention, that the amplification and negative feedback of the common mode voltages, along with the development of a common mode error voltage, uniquely causes the common mode voltage drifts of the overall differential amplifier circuit to be reduced to a very low value. Further, the utilization of a reference voltage in comparison with the negative feedback voltage advantageously provides an overall differential output voltage which is substantially "locked to" a reference voltage.

It will be further apparent, that although the feedback feature of the present invention uniquely produces an advantageous reduction in the overall common mode drift of the differential amplifier circuit, such feature does not significantly affect the differential mode gain of the circuit. Accordingly, stabilization of both the differential and common mode voltages of the differential input voltage is uniquely achieved by virtue of the negative feedback arrangement of the present invention.

Accordingly, a primary object of the persent invention is to provide a differential amplifier circuit which uniquely causes the common mode voltage drifts of the circuit to be reduced to very low values.

Another object of the persent invention is to provide a differential amplifier circuit wherein the overall differential output voltages are substantially "locked to" a reference voltage.

It is another object of the present invention to provide a differential amplifier circuit wherein a highly amplified negative common mode feedback voltage is advantageously utilized to reduce the common mode drift characteristics of the circuit to substantially insignificant values.

It is another object of the present invention to provide a direct coupled, multistage, balanced differential amplifier circuit which uniquely develops and utilizes a highly amplified negative common mode feedback voltage for providing high differential mode gain, stabilized differential amplification with respect to the common mode reference voltage, and low overall differential and common mode drift characteristics.

It is another object of the present invention to provide a differential amplifier circuit of the type described which has high common mode voltage gain characteristics and advantageously utilizes this common mode voltage in a negative feedback arrangement so as to uniquely compensate and eliminate any common mode voltage drifts present in the overall circuit.

It is another object of the present invention to provide a differential amplifier circuit of the type described which is simple in construction, economical to manufacture, and highly efficient in achieving the desired objects and performing the intended functions.

These and further objects and advantages of the present invention will become apparent upon reference to the following description and claims and the appended drawings wherein:

*Detailed description—FIGURES 1–5*

Figure 1:
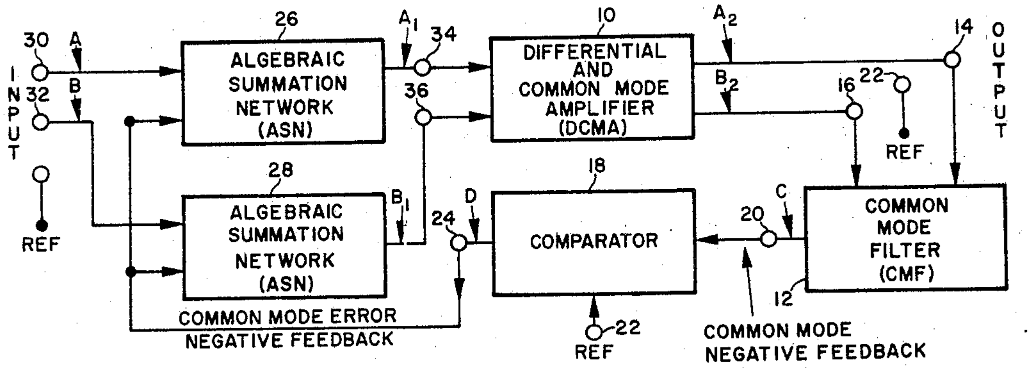
FIGURE 1 is a block diagram of one exemplary embodiment of the present invention.

FIGURE 1 depicts a block diagram of a first exemplary embodiment of the present invention whereas FIGURES 2–5 depict exemplary circuits which may be incorporated into the block diagram of FIGURE 1. The specific substitution of the circuits of FIGURES 2–5 into the diagram of FIGURE 1 will be discussed more fully below.

Referring to FIGURE 1, a differential and common mode amplifier (DCMA) 10 is provided for amplifying differential voltages. The DCMA 10 is of the type which provides high differential and common mode voltage gain and has low differential mode voltage drift characteristics. As in most differential amplifiers, the common mode voltage drifts are most undesirable since accurate indications of the voltage difference between the two input voltages is not obtainable in a single ended output arrangement when the common mode voltage randomly drifts above or below a known or desired reference voltage. For purposes which will hereinafter be apparent, the description of FIGURE 1 will commence from the output of the DCMA rather than conventionally from its input.

In order to compensate for the undesirable effects of common mode voltage drifts, the two output voltages, $A_2$ and $B_2$ of the DCMA 10, are simultaneously coupled to a common mode filter (CMF) 12 via output terminals 14 and 16, respectively. The CMF 12 is designed to pass only the common mode voltages of the output voltages $A_2$ and $B_2$. The common mode voltage C of the CMF 12 is now delivered to a comparator 18 via output terminal 20 wherein the common mode voltage C is compared with a reference voltage, which reference voltage is applied at terminal 22. The comparator 18 develops a common mode error voltage D, which is simultaneously delivered via output terminal 24 to one input of each of two algebraic summation networks (ASN) 26 and 28. The differential input voltages A and B, which are to be differentially amplified, are respectively delivered to the other ASN inputs via terminals 30 and 32, respectively. Each of the ASN networks 26 and 28 algebraically sum the differential input voltages A and B respectively with the common mode error voltage D. The output voltages $A_1$ and $B_1$ of the ASN's 26 and 28, respectively, are then delivered to the DCMA 10 via terminals 34 and 36, respectively, wherein both the common mode and differential mode components of the voltages $A_1$ and $B_1$ are amplified. The reference voltage terminal 22 is also common to the input terminals 30 and 32 and the output terminals 14 and 16.

It should be again noted at this point, that the DCMA 10 is specially designed to provide high common mode voltage gain. Further, the DCMA 10 in combination with the CMF 12 and comparator 18 develop a highly amplified common mode error voltage which is negative with respect to the overall common mode voltages of the circuit, and which error voltage when algebraically summed with the differential input voltages A and B in the ASN networks 26 and 28 not only compensates dynamically for any unwanted common mode voltage drifts but also "locks" the common mode voltage to a desired reference voltage level. A mode of operation of the differential amplifier circuit of FIGURE 1 will be discussed below.

In the following detailed description of FIGURES 2–5, the elements and components of these figures which correspond to elements and components of FIGURE 1 are given the same reference numeral for purposes of clarity and understanding.

Figure 2:
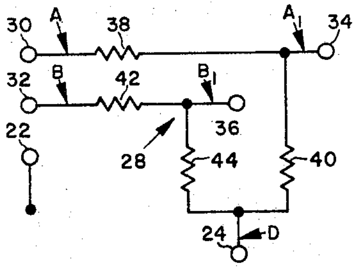
FIGURE 2 is an exemplary embodiment of an algebraic summation network which may be used in the circuit of FIGURE 1.

Referring now to FIGURE 2, there is shown an exemplary embodiment of an algebraic summation network (ASN) which may be used in the circuit of FIGURE 1. The ASN 26 comprises resistor 38, which is serially connected between terminals 30 and 34, and resistor 40, which is serially connected between terminals 24 and 34. The ASN 28 comprises resistor 42, which is serially connected between terminals 32 and 36, and resistor 44, which is serially connected between terminals 24 and 36. The circuit of FIGURE 2 may be used as the algebraic summation networks 26 and 28 in the circuit of FIGURE 1. The input voltages A and B are respectively applied to input terminals 30 and 32, and the common mode error voltage D, developed by the comparator 18, is applied to terminal 24, whereas the reference voltage is applied to terminal 22. Accordingly, the summation voltages $A_1$ and $B_1$ are respectively developed and available at terminals 34 and 36.

Figure 3:
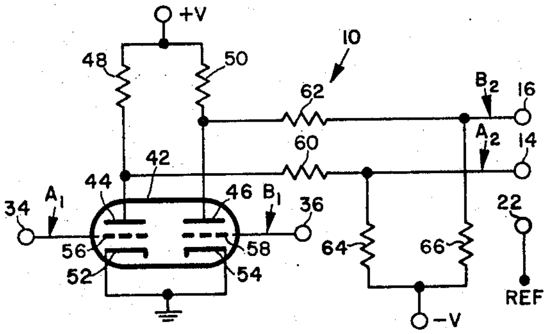
FIGURE 3 is an exemplary embodiment of a differential and common mode amplifier which may be used in the circuit of FIGURE 1.

Referring now to FIGURE 3, there is shown a differential and common mode amplifier (DCMA) circuit which may be used in the circuit of FIGURE 1. The DCMA 10, as depicted here, comprises a twin triode, single envelope, vacuum tube 42 which has its anodes 44 and 46 connected to a positive supply voltage +V through resistors 48 and 50, respectively, and its cathodes 52 and 54 connected in common to ground. The control electrodes 56 and 58 of tube 42 are respectively connected to terminals 34 and 36. The anodes 44 and 46 of tube 42 are also connected to terminals 14 and 16, respectively, via resistors 60 and 62, respectively. The terminals 14 and 16 are respectively connected to a negative supply voltage −V via resistors 64 and 66. The summation voltages $A_1$ and $B_1$ are respectively connected to terminals 34 and 36 while the reference voltage is coupled to terminal 22.

It should be noted, that the DCMA of FIGURE 3 will differentially amplify both the common mode and differential mode components of the summation voltages $A_1$ and $B_1$ developed by the ASN networks 26 and 28 and respectively deliver the amplified voltages, $A_2$ and $B_2$, to terminals 14 and 16. It should also be noted that the DCMA 10 is of the type which has inherently low differential mode voltage drifts but is not capable, in and of itself, to compensate for common mode voltage drifts caused, for example, by power supply or temperature variations. This latter aspect has been a constant problem in the prior development and use of differential amplifiers. It is at this point in the circuits of prior known differential amplifier that skilled artisans have attempted to either eliminate or compensate for common mode voltage drifts.

Figure 4:
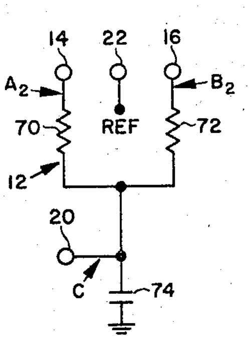
FIGURE 4 is an exemplary embodiment of a common mode filter which may be used in the circuit of FIGURE 1.

Referring now to FIGURE 4, there is shown a common mode filter (CMF) which may be used in the circuit of FIGURE 1. The CMF 12, as depicted here, comprises a pair of resistors 70 and 72, which have one of their ends respectively connected to terminals 14 and 16 and their other ends each connected to terminal 20. A capacitor 74 is connected between terminal 20 and ground. The amplified voltages $A_2$ and $B_2$, developed by the DCMA 10, which comprise both differential and common mode voltage components, are respectively connected to terminals 14 and 16 whereas the common mode feedback voltage C appears on terminal 20.

Figure 5:
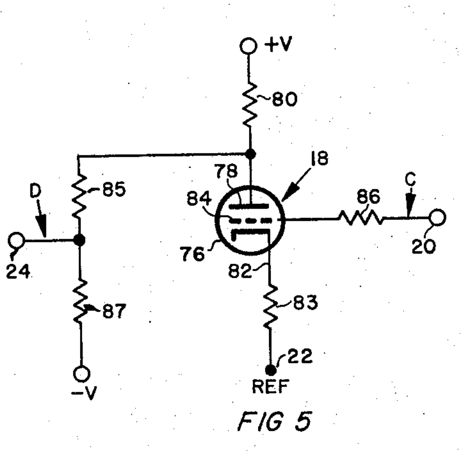
FIGURE 5 is an exemplary embodiment of a comparator which may be used in the circuit of FIGURE 1.

Referring now to FIGURE 5, there is shown a comparator which may be used in the circuit of FIGURE 1. The comparator 18, as shown here, comprises a triode vacuum tube 76 which has its anode 78 coupled to a positive supply voltage +V via resistor 80 and its cathode 82 connected to a reference voltage via resistor 83 and terminal 22. The control electrode 84 of tube 76 is connected to terminal 20 via resistor 86. The anode 78 of tube 76 is also directly connected to the negative supply voltage −V via the two series resistors 85 and 87. The output terminal 24 is connected to the junction of resistors 85 and 87. It will be apparent, therefore, that the common mode feedback voltage C, developed by the CMF 12, is delivered to tube 76 via terminal 20 whereas the common mode error voltage D appears at terminal 24.

*Mode of operation—FIGURES 1–5*

A mode of operation of the circuit of FIGURE 1 with the exemplary component circuits of FIGURES 2–5 is as follows:

When the input voltages A and B are respectively applied to input terminals 30 and 32, loop currents are caused to flow through resistor 38 and 40 of the ASN 26 and resistors 42 and 44 of the ASN 28 as best seen in FIGURE 2. The application of the common mode error negative feedback voltage D from the comparator 18 to the ASN networks 26 and 28 also cause loop currents to flow through resistors 38 and 40 of ASN 26 and resistors 42 and 44 of ASN 28. It will be apparent therefore, that the loop currents caused by the input voltages A and B and the error voltage D in the ASN networks 26 and 28 cause an algebraic summation of the voltages A and D in ASN 26 and voltages B and D in ASN 28.

It should be noted at this point, that the loop currents flowing in the ASN networks 26 and 28 are dependent upon the ratio and resistance of the series connected resistors of the ASN networks 26 and 28. By way of example, the ratio of resistors 38 and 40 may be equal to the ratio of resistors 42 and 44. Also, it should be noted that the voltages which represent the algebraic summation of the input voltages A and B respectively with the error voltage D will appear on the terminals 34 and 36, i.e., summation voltages $A_1$ and $B_1$, and are respectively applied to the control electrodes 56 and 58 of the twin triode 42.

The voltages $A_1$ and $B_1$ are then differentially amplified by the DCMA 10 so that an amplified version (voltages $A_2$ and $B_2$) of the voltages $A_1$ and $B_1$ will appear, respectively, at the output voltage terminals 14 and 16. The terminals 14 and 16, as seen in FIGURE 3, are the output terminals for the differential amplifier circuit per se. However, in order to develop a negative common mode error voltage, the amplified voltages $A_2$ and $B_2$ are respectively coupled to the CMF 12, as shown in detail, for example, in FIGURE 4. The CMF 12 is designed so as to pass only the common mode voltage which appears on the terminals 14 and 16. This filter operates by virtue of the fact that in the absence of a common mode voltage, the voltages at terminals 14 and 16, with respect to the reference terminal are equal and of opposite polarity. Thus, a center tapped resistor connected across the terminals 14 and 16 would show zero potential difference between the center tap and the reference terminal. However, if a common mode voltage is present at terminals 14 and 16, a potential difference, which is equal to the common mode voltage, will appear between the center tap and the reference terminal. The desired filtering of the common mode voltage by the CMF 12 is provided by the application of the voltages $A_2$ and $B_2$ to resistors 70 and 72, respectively, of the CMF 12. Since one end each of the resistors 70 and 72 are connected in common and since these resistors are of equal value, the common mode components of the amplified voltages $A_2$ and $B_2$ cause loop currents to flow in the same direction through resistors 70 and 72. However, the differential components of the voltages $A_2$ and $B_2$ cause loop currents to flow in opposite directions with respect to each other through the resistors 70 and 72. Thus, the common mode component of voltages $A_2$ and $B_2$ will appear at terminal 20 whereas the differential voltages will be substantially cancelled out. The capacitor 74, which is connected between terminal 20 and ground, is provided for shunting any voltage components superimposed on the amplified voltages $A_2$ and $B_2$ which have a frequency higher than the operating frequency of the overall circuit, so as to prevent feedback of such high frequency components to the DCMA 10. It should be noted, that if undesirable high frequency components are fed back, the circuit may be driven into oscillation. This is so because stray and interelectrode capacity of the circuit may cause the phase of such high frequency components to shift. This shift in phase of these undesirable frequency components coupled with the high loop gain of the circuit may cause undesirable oscillation.

Accordingly, the common mode voltage which appears on terminal 20 of the CMF 12 is then applied to the control electrode 84 of the comparator 18. The vacuum tube 76 of the comparator 18 is designed so as to generate a voltage representing the difference between the common mode voltage applied to the control electrode 84 and the reference voltage applied to the cathode 82. The unbypassed resistor 83 in the cathode circuit of tube 76 provides the required grid-cathode bias. Also, by the expedient of coupling a reference voltage to the terminal 22, a difference voltage is developed across the plate resistor 80 when the common mode voltage C is applied to the terminal 20. It should be noted that the voltage dividing resistors 85 and 87 translate the voltage developed across anode resistor 80 a sufficient amount so as to compensate for the grid-anode bias of tube 76. Accordingly, the voltage D, developed at the junction of resistors 85 and 87, represents the difference between the common mode voltage C and the reference voltage. The voltage D will be hereinafter referred to as the common mode error voltage.

It should be also noted at this point that the DCMA 10 in combination with the CMF 12 and comparator 18 is preferably designed so that the common mode error voltage D is negative with respect to the overall common mode voltage of the differential amplifier circuit.

The common mode error voltage D is then applied simultaneously to the ASN network 26 and 28 where, as mentioned above, they are algebraically summed respectively with the input voltages A and B for development of the summation voltages $A_1$ and $B_1$.

Figure 6:
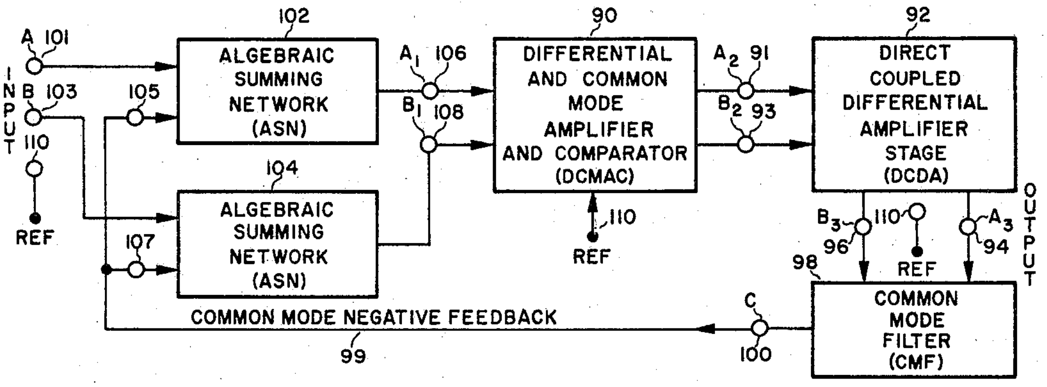
FIGURE 6 is a block diagram of an alternate embodiment of the present invention.
Figure 7:
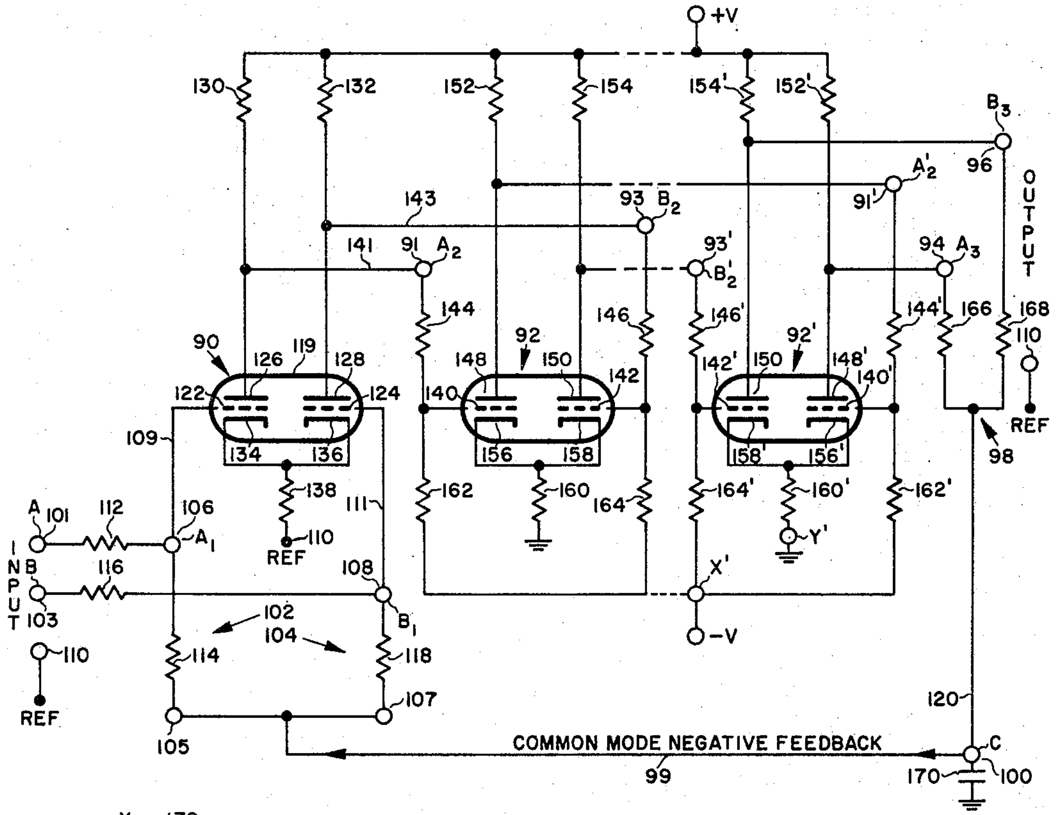
FIGURE 7 is a schematic representation of the block diagram of FIGURE 6, utilizing vacuum tubes as the active elements.
Figure 8:
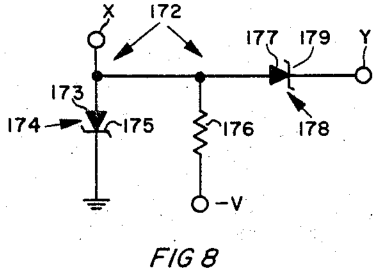
FIGURE 8 is a schematic of a biasing network which may be utilized in combination with the circuit of FIGURE 7.

*Detailed description—FIGURES 6–8*

FIGURE 6 depicts a block diagram of another exemplary embodiment of the present invention, whereas FIGURE 7 shows an exemplary schematic representation of FIGURE 6 utilizing vacuum tubes as the active elements and FIGURE 8 shows a schematic of a biasing network which may be utilized in combination with the circuit of FIGURE 7.

Referring to FIGURE 6, a differential and common mode amplifier and comparator (DCMAC) 90 is provided for amplifying differential voltages applied to its inputs and for comparing a common mode negative feedback voltage with a reference voltage. The DCMAC 90 is of the type which inherently provides high differential and common mode voltage gain and has low differential mode voltage drift characteristics. For purposes which will hereinafter be apparent, the description of FIGURE 6 will commence from the output of the DCMAC 90 rather than conventionally from its input.

In order to compensate for the undesirable effects of common mode voltage drifts, the two output voltages $A_2$ and $B_2$ of the DCMAC 90 are simultaneously coupled, via terminals 91 and 93, respectively, to a plurality of cascaded direct coupled differential amplifier (DCDA) stages 92 for further amplification of both the common mode and differential mode components of the voltages $A_2$ and $B_2$. It is to be noted that the DCDA 92 may be excluded if additional amplification is not necessary without departing from the spirit and scope of the present invention. It has been determined, however, that in certain applications, such as when the input voltages A and B are very low values, additional amplification is desirable.

The output voltages $A_3$ and $B_3$ of the DCDA 92 are delivered to output terminals 94 and 96, and are simultaneously coupled to a common mode filter (CMF) 98. The CMF 98 is designed to pass only the common mode voltages of the output voltages $A_3$ and $B_3$. The common mode voltage C developed by the CMF 98 is then simultaneously delivered, via the output terminal 100 and conductor 99, to one input (terminals 105 and 107) of each of two algebraic summing networks (ASN) 102 and 104. The differential input voltages A and B, which are to be differentially amplified, are respectively delivered to the other ASN inputs via terminals 101 and 103, respectively. Each of the ASN networks 102 and 104 algebraically sum the differential input voltages A and B respectively with the common mode voltage C. The output voltages $A_1$ and $B_1$ of the ASN networks 102 and 104, respectively, are then delivered to the DCMAC 90 via terminals 106 and 108, respectively, wherein the voltages $A_1$ and $B_1$ are differentially amplified and compared with the reference voltage applied at terminal 110 of the DCMAC 90. The reference voltage terminal 110 is also common to the input terminals 102 and 104 and the output terminals 94 and 96.

For reasons similar to that mentioned above with regard to the DCMA 10 of FIGURE 1, the DCMAC 90 is specially designed to provide high common mode gain. Also, the DCMAC 90, in combination with the DCDA 92 and CMF 98, develops a highly amplified common mode voltage, which is negative with respect to the overall common mode voltage of the circuit, and which common mode voltage when algebrically summed with the differential voltages A and B in the ASN networks 102 and 104, compensates for any unwanted common mode voltage drifts which may exist in the overall circuit and "locks" the common mode voltage to a desired reference voltage level. A mode of operation of the differential amplifier circuit of FIGURE 6 will be discussed below.

In the following detailed description of FIGURES 7 and 8, the elements and components of these figures which correspond to elements and components of FIGURE 6 are given the same reference numeral for purposes of clarity and understanding.

Referring now to FIGURE 7, the ASN 102 comprises resistor 112, which is serially connected between terminals 101 and 106, and resistor 114 which is serially connected between terminals 105 and 106. The ASN 104 comprises resistor 116, which is serially connected between terminals 103 and 108, and resistor 118, which is serially connected between terminals 107 and 108. The differential input voltages A and B, which are to be differentially amplified, are respectively applied to input terminals 101 and 103 and the negative common mode feedback voltage C, developed by the CMF 98, is applied simultaneously to terminals 105 and 107 via conductor 120, terminal 100 and conductor 99. Accordingly, the summation voltages $A_1$ and $B_1$ are respectively developed in the ASN networks 102 and 104 and are available at terminals 106 and 108. The summation voltages $A_1$ and $B_1$ are respectively coupled to the control electrodes 122 and 124 of the DCMAC 90 via conductors 109 and 111, which are respectively connected to terminals 106 and 108. The twin triode, single envelope, vacuum tube 119 of the DCMAC 90 has its anodes 126 and 128 connected to a positive supply voltage +V through resistors 130 and 132, respectively, and its cathodes 134 and 136 connected in common to a reference voltage via resistor 138. The anodes 126 and 128 of vacuum tube 119 are also respectively coupled to terminals 91 and 93.

It should be noted at this point, that the DCMAC 90 has a dual function. First, it amplifies both the differential and common mode components of the summation voltages $A_1$ and $B_1$ and respectively delivers an amplified version of these voltages to terminals 91 and 93 via conductors 141 and 143, which are respectively connected to anodes 126 and 128. Second, it compares the common mode component of the summation voltages $A_1$ and $B_2$ with the reference voltage applied to the cathodes 134 and 136 of tube 119 for developing a common mode error voltage. A detailed description of the operation of the DCMAC 90 will be discussed more fully below.

Referring now to the middle section of FIGURE 7, there are shown two DCDA stages, generally indicated at 92 and 92'. The DCDA stages are cascaded and are identical in all respects. Therefore, for purposes of this description, only the first stage will be described in detail with the corresponding elements in the second stage being given corresponding primed reference numerals. It is to be understood that a plurality of DCDA stages may be used for providing the required or necessary gain characteristics. This fact is graphically shown by use of the dotted lines connecting the first DCDA stage to the last DCDA stage.

The amplified voltages $A_2$ and $B_2$, which are developed by the DCMAC 90, are respectively coupled to the control electrodes 140 and 142 of DCDA 92 via resistors 144 and 146. The anodes 148 and 150 of the DCDA 92 are respectively coupled to the positive supply voltage +V via resistors 152 and 154 whereas the cathodes 156 and 158 are connected in common to ground via resistor 160. The control electrodes 140 and 142 are connected to the negative supply voltage −V via resistors 162 and 164, respectively. The voltages $A_2$ and $B_2$, which are respectively applied to the control electrodes 140 and 142 of the DCDA 92, will be differentially amplified and respectively coupled to the DCDA 92'. The voltages $A_2'$ and $B_2'$, which are developed by the DCDA 92, are then respectively applied to the control electrodes 140' and 142' of the DCDA 92', and further differentially amplified by the DCDA 92'. The voltages $A_3$ and $B_3$, which appear at the output terminals 94 and 96, are simultaneously coupled to the CMF 98.

The CMF 98 comprises a pair of resistors 166 and 168, which have one of their ends respectively connected to terminals 94 and 96 and their other ends each connected to terminal 100 via conductor 120. A capacitor 170 is connected between terminal 100 and ground. The common mode voltage C, which is passed by the CMF 98 and present on terminal 100, is then simultaneously applied to the ASN networks 102 and 104 via conductor 99 and terminals 105 and 107. A detailed description of the operation of the DCDA circuits 92 and 92' and the CMF 98 will be discussed below.

Referring now to FIGURE 8, there is shown a schematic of a biasing network which may be utilized in the last stage of the cascaded DCDA stages of FIGURE 7. The biasing network (BN), generally indicated at 172, comprises a zener diode 174 having its anode 173 connected to terminal X and its cathode 175 connected to ground, a resistor 176 coupled between terminal X and a negative supply voltage −V, and a zener diode 178 having its anode 177 connected to terminal X and its cathode connected to terminal Y. The BN 172 may be incorporated in the cathode circuit of the last stage of the DCDA 92 of FIGURE 7 by removing the negative supply voltage −V connected to terminal X' and the ground connected to terminal Y'. Then it is merely necessary to connect terminals X and Y of FIGURE 8 to terminals X' and Y', respectively, of FIGURE 7. The operation of the BN 172 will be described below.

*Mode of operation—FIGURES 6–8*

A mode of operation of the circuit of FIGURE 6 with specific reference to the exemplary circuits of FIGURES 7 and 8 is as follows:

When the differential input voltages A and B, which are to be differentially amplified, are respectively applied to the input terminals 101 and 103, loop currents are caused to flow through resistors 112 and 114 of ASN 102 and resistors 116 and 118 of ASN 104. The common mode negative feedback voltage C, which is fed back to the ASN networks 102 and 104 from the CMF 98, also cause loop currents to flow through resistors 112 and 114 of ASN 102 and resistors 116 and 118 of ASN 104. As mentioned above with regard to the mode of operation of the embodiment of FIGURES 1–5, the loop currents caused by the inputs A and B and the common mode negative feedback voltage C in the ASN networks 102 and 104 cause an algebraic summation of the voltages A and C in ASN 102 and voltages B and C in the ASN 104. Also, the loop currents flowing in the ASN networks 102 and 104 are dependent upon the ratio and resistance of the series connected resistors of the ASN networks 102 and 104. Further, the voltages which represent the algebraic summation of the input voltages A and B respectively with the common mode negative feedback voltage C. will be present on the terminals 106 and 108 (i.e. summation voltages $A_1$ and $B_1$), and are respectively applied to the control electrodes 122 and 124 of the DCMAC 90. The differential and common mode components of the voltages $A_1$ and $B_1$ are accordingly amplified by the DCMAC 90 so that an amplified version of the voltages $A_1$ and $B_1$ (voltages $A_2$ and $B_2$) will be available, respectively, at the terminals 91 and 93 of the DCMAC 90. In addition, the DCMAC 90 compares the common mode components of the voltages $A_1$ and $B_1$ with the reference voltage applied to the cathodes 134 and 136 via resistor 138 for developing a common mode error voltage so as to compensate for the common mode voltage drifts of the overall circuit. That is to say, any common mode voltage drifts superimposed on the differential input voltages A and B or caused by the circuit components or operation will be compensated for by the development of a highly amplified common mode negative feedback voltage by the CMF 98 and by the feedback of this voltage to the DCMAC 90 through the ASN networks 102 and 104 for comparison with the reference voltage. The comparison of the feedback and reference voltages advantageously develops the common mode error voltage which dynamically compensates for the common mode voltage drifts of the overall circuit.

The voltages $A_2$ and $B_2$, which are developed by the DCMAC 90, are then delivered to the first stage of the DCDA 92 via terminals 91 and 93 and resistors 144 and 146 respectively. The DCDA 92, the first differential and common mode amplifier stage, is provided for further amplifying both the differential and common mode components of voltages $A_2$ and $B_2$. Although the circuit is designed to provide high differential and common mode gain characteristics, it is to be understood that the gain of the differential components may not necessarily be equal to the gain of the common mode components. The specific gain characteristics of the circuit are based upon the desirable differential mode forward gain and common mode loop gain requirements. It is to be understood, however, that although the cascaded stages of differential amplifiers which make up the DCDA 92 are conventional, the number of stages, which may be none at all, must be such that the common mode closed loop path, as shown in FIGURE 6, has a negative gain characteristic. Accordingly, any well known means for providing the proper sense for the common mode feedback voltage C may be incorporated into the circuit without departing from the spirit and scope of the present invention.

The voltages $A_3$ and $B_3$ are then respectively coupled to the CMF 98 which is designed to pass only the common mode voltages appearing on the output terminals 94 and 96. The CMF 98 operates in substantially the same manner as the CMF 12 as described above with regard to the operation of FIGURES 1–5. That is, the desired filtering of the common mode voltage by the CMF 98 is perfected by the application of the voltages $A_3$ and $B_3$ to resistors 166 and 168, respectively, of the CMF 98. Since one end each of the resistors 166 and 168 are connected in common and since these resistors are of equal value, the common mode components of the amplified voltages $A_3$ and $B_3$ cause loop currents to flow through resistors 166 and 168 in the same direction. However, the differential mode components of the voltages $A_3$ and $B_3$ cause loop currents to flow in opposite direction, with respect to each other, through the resistors 166 and 168. Thus, the common mode components of the voltages $A_3$ and $B_3$ will appear at terminal 100 whereas the differential mode components of voltages $A_3$ and $B_3$ will be substantially cancelled out. Accordingly, the voltage C, which is present on terminal 100, will be a highly amplified version of the common mode voltage components of the voltages $A_2$ and $B_2$ appearing on terminals 91 and 93 and will be of proper sense so as to be negative with respect to the overall common mode voltage components of the differential amplifier circuit.

The capacitor 170, which is connected between terminal 100 and ground, is provided for shunting any voltage components superimposed on the voltages $A_3$ and $B_3$, which have a frequency higher than the operating frequency of the overall circuit so as to prevent feedback of such high frequency components to the DCMAC 90. The purpose and operation of capacitor 170 in this embodiment is substantially the same as above described with regard to capacitor 74 of the embodiment of FIGURES 1–5. The high negative common mode feedback voltage C is then simultaneously applied to the ASN inputs 105 and 107 where it is algebraically summed with the differential input voltages A and B, respectively, as described earlier.

It should be noted that the unbypassed resistors 138, 160 and 160′ of DCMAC 90, DCDA 92 and DCDA 92′, respectively, provide the required grid-cathode bias for the vacuum tubes of these stages. It should be also noted, that the DCMAC 90, DCDA 92 and DCDA 92′ not only amplify the differential mode voltages applied to the circuit but also amplify any common mode voltages injected into the circuit, such as, by power supply or temperature variations. Accordingly, as a result of the high common mode forward gain characteristics of this embodiment and the common mode negative feedback feature, any common mode voltage drifts of the circuit are caused to progressively approach zero so that the common mode voltage components of the overall output of the circuit approaches or "locks to" the reference voltage.

Referring now to the operation of the BN 172, the voltage divider, which comprises resistors 154, 146′, 164′ and 176 in series connection between the positive and negative supply voltages +V and −V, respectively, is designed so that the voltage at terminal X is above the zener breakdown voltage of zener diodes 174 and 178 whereby the zener diodes will be drawing reverse current. A current path can be traced from cathodes 156′ and 158′ of DCDA 92′ to terminal X via resistor 160′, terminal Y, and zener diode 178. At this point the current path divides through two branches of a parallel network. The first branch of the parallel network comprises zener diode 174 which is connected between terminal X and ground where as the second branch of the parallel network comprises resistor 176 which is connected between terminal X and the negative supply voltage −V.

It will be apparent that the common mode gain of the DCDA 92′ will be undesirably decreased if the voltage on the cathodes 156′ and 158′ is permitted to follow the voltage changes occurring on the control electrodes 140′ and 142′ as a result of the common mode components of voltages $A_2'$ and $B_2'$. This latter condition is commonly referred to as degeneration. Therefore, the voltage at terminal Y must be held substantially constant to avoid any undesirable common mode degeneration in the operation of the DCDA 92′. The voltage a terminal Y is held constant and at a predetermined value by the inclusion of the back-to-back zener diodes 174 and 178 of the BN 172. The zener diode 178 primarily provides the desired bias for the cathodes 156′ and 158′ of DCDA 92′. However, when there occurs a change in current flow through the resistor 160′ of DCDA 92′ as a result of the application of the common mode components of voltages $A_2'$ and $B_2'$ to the control electrodes 140′ and 142′, the zener diode 174 provides a parallel path for such changes in current flow thereby preventing the voltage at terminal X from changing. Thus, by virtue of the inherent characteristics of zener diodes, although a current change exists through zener diode 174, no voltage change occurs at terminal X. It will be apparent, therefore, that the back-to-back diodes 174 and 178 if the BN 172 advantageously prevent degeneration of the DCDA 92' by virtue of the fact that the voltages at terminals X and Y are held substantially constant.

Figure 9:
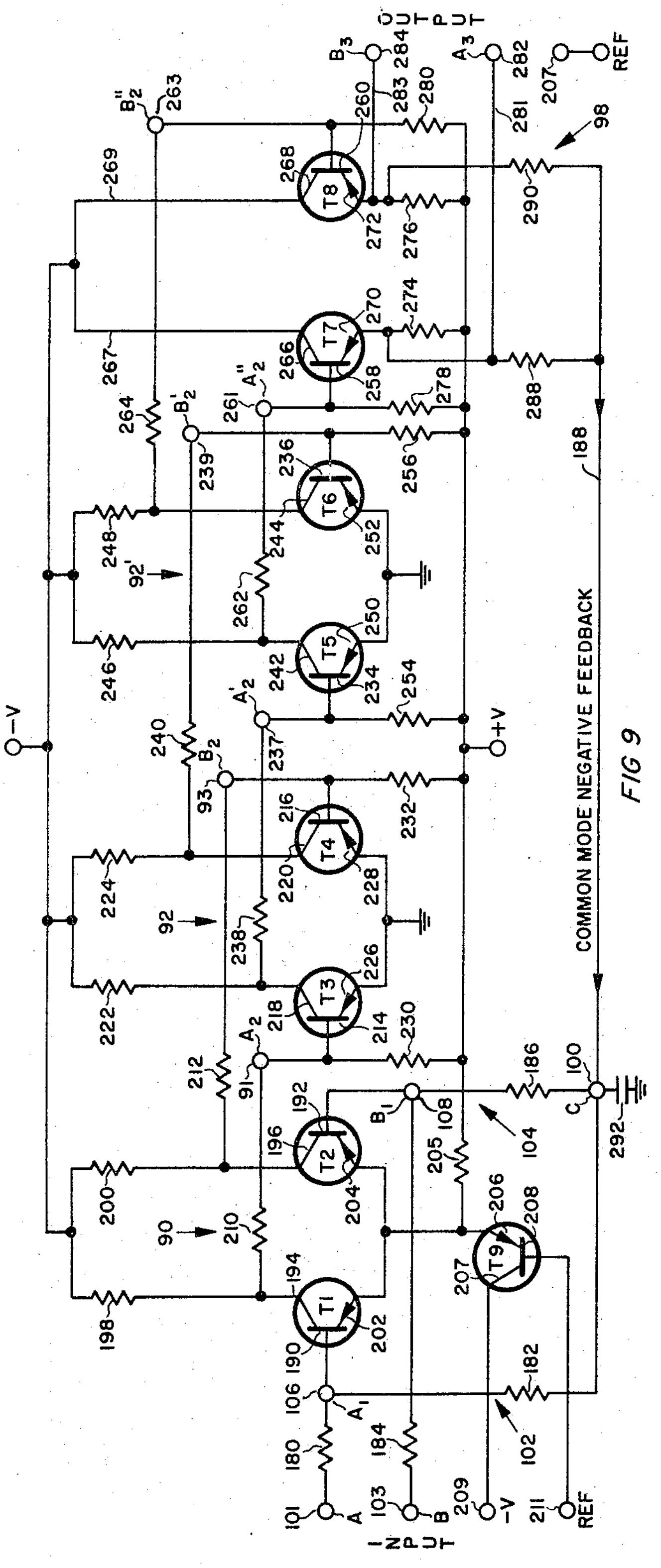
FIGURE 9 is a schematic representation of the block diagram of FIGURE 6 utilizing transistors as the active elements.

*Detailed description—FIGURE 9*

Referring now to FIGURE 9, there is shown a schematic representation of the differential amplifier circuit of FIGURE 6 utilizing transistors as the active elements. For purposes of clarification, components of this embodiment which correspond to components of the ASN 102 and 104, DCMAC 90, DCDA 92 and the CMF 98 of FIGURE 6 will be referenced with the same characters as used in the foregoing description of FIGURE 6.

The ASN 102 comprises resistor 180, which is serially connected between terminals 101 and 106, and resistor 182 which is serially connected between terminals 100 and 106. The ASN 104 comprises resistor 184, which is serially connected between terminals 103 and 108, and resistor 186 which is serially connected between terminals 100 and 108. The input voltages A and B are respectively applied to terminals 101 and 103 and the highly amplified common mode negative feedback voltage C, developed by the CMF 98, is applied to terminal 100 via conductor 188. Accordingly, the summation voltages $A_1$ and $B_1$, which are present at terminals 106 and 108, respectively, are respectively coupled to the base electrodes 190 and 192 of transistors $T_1$ and $T_2$ of the DCMAC 90 via terminals 106 and 108. The collector electrodes 194 and 196 of transistors $T_1$ and $T_2$ are connected to a negative supply voltage —V via resistors 198 and 200, respectively, whereas the emitter electrodes 202 and 204 of these transistors are connected in common to the emitter electrodes 206 of transistor $T_9$, which is also connected to a positive supply voltage +V via resistor 205. The collector electrode 207 of transistor $T_9$ is connected to the negative supply voltage —V via terminal 209, whereas the base electrode 208 of transistor $T_9$ is connected to a reference potential via terminal 211. The transistor $T_9$ is connected in circuit so that its operating base-emitter bias will offset the operating bias or transistors $T_1$ and $T_2$. The collector electrodes 194 and 196 of transistors $T_1$ and $T_2$ are also respectively connected to terminals 91 and 93 via resistors 210 and 212, respectively.

It should be briefly noted at this point that the DCMAC 90 has the dual function of amplifying both the differential and common mode components of the summation voltages $A_1$ and $B_1$ and comparing the common mode components of the summation voltages $A_1$ and $B_1$ with the references voltage for developing a common mode error voltage. A detailed description of the operation of the ASN networks 102 and 104 and the DCMAC 90 of this embodiment will be discussed more fully below.

Referring now to the middle section of FIGURE 9, there are shown two DCDA stages, generally indicated at 92 and 92'. The amplified voltages $A_2$ and $B_2$, which respectively appear on terminals 91 and 93, are respectively coupled to the base electrodes 214 and 216 of transistors $T_3$ and $T_4$ of the DCDA 92. The collector electrodes 218 and 220 of transistors $T_3$ and $T_4$ are respectively coupled to the negative supply voltage —V via resistors 222 and 224 whereas the emitter electrodes 226 and 228 of transistor $T_3$ and $T_4$ are connected in common to ground. The base electrodes 214 and 216 of these transistors are also connected to the negative supply voltage via resistors 230 and 232, respectively. The collector electrodes 218 and 220 of transistors $T_3$ and $T_4$ are also respectively connected to the base electrodes 234 and 236 of transistors $T_5$ and $T_6$ of the DCDA 92' via resistors 238 and 240 and terminals 237 and 239, respectively. Accordingly, the voltages $A_2'$ and $B_2'$, which are present at terminals 237 and 239, respectively, will be further amplified differentially by the DCDA 92'. The collector electrodes 242 and 244 of transistor $T_5$ and $T_6$ are respectively connected to the negative supply voltage —V via resistors 246 and 248, whereas the emitter electrodes 250 and 252 of these transistors are connected in common to ground. The base electrodes 234 and 236 of transistors $T_5$ and $T_6$ are also connected to the positive supply voltage +V via resistors 254 and 256, respectively. The collector electrodes 242 and 244 of transistors $T_5$ and $T_6$ are also connected to base electrodes 258 and 260 of transistors $T_7$ and $T_8$ via resistors 262 and 264 and terminals 261 and 263, respectively. Transistors $T_7$ and $T_8$ are connected in an emitter-follower arrangement so as to provide low impedance coupling from the output terminals 261 and 263 of DCDA 92' to the input of CMF 98. Accordingly, the voltages $A_2''$ and $B_2''$ appearing on terminals 282 and 284 of the emitter follows $T_7$ and $T_8$, respectively, will be delivered respectively to the resistors 288 and 290 of CMF 98. It should be noted at this point that any number of DCDA stages may be utilized without departing from the spirit and scope of the present invention provided of course that the DCDA stages used in combination with the emitter followers $T_7$ and $T_8$ provide a negative feedback voltage with respect to the overall common mode voltage of the circuit.

The base electrodes 258 and 260 of transistor $T_7$ and $T_8$ are also connected to the positive voltage supply +V via resistors 278 and 280, respectively. The collector electrodes 266 and 268 of transistor $T_7$ and $T_8$ are each directly connected to the negative supply voltage —V via conductors 267 and 269, whereas the emitter electrodes 270 and 272 of these transistors are respectively connected to the positive supply voltage +V via resistors 274 and 276, respectively. The emitter electrodes 270 and 272 are also connected to the overall output terminals 282 and 284, respectively, via conductors 281 and 283. Accordingly, the voltages $A_3$ and $B_3$, which appear at the output terminals 282 and 284 of the circuit, are then simultaneously applied to the CMF 98, which is designed to pass only the common mode voltage appearing on the terminals 282 and 284. The CMF 98 comprises a pair of resistors 288 and 290, which have one of their ends respectively coupled to terminals 282 and 284 and their other ends each connected to terminal 100 via conductor 188. A capacitor 292 is connected between terminal 100 and ground. It will be apparent, therefore, that the CMF 98, to which the voltages $A_3$ and $B_3$ are simultaneously applied, will pass only the highly amplified common mode components of these voltages and will deliver the common mode negative feedback voltage C simultaneously to the ASN networks 102 and 104. A detailed description of the operation of the DCDA circuits 92 and 92', the emitter-followers $T_7$ and $T_8$, and the CMF 98 will be discussed below.

*Mode of operation—FIGURE 9*

A mode of operation of the circuit of FIGURE 6 with specific reference to the exemplary circuit of FIGURE 9 is as follows:

When the differential input signals A and B, which are to be differentially amplified, are respectively applied to terminals 101 and 103, loop currents are caused to flow through resistors 180 and 182 of ASN 102 and resistors 184 and 186 of ASN 104. The common mode negative feedback voltage C, which is fed back to the ASN networks 102 and 104 from the CMF 98, also causes loop currents to flow through resistors 180 and 182 of ASN 102 and resistors 184 and 186 of ASN 104. The operation of the ASN networks 102 and 104 is substantially the same as above described with regard to the embodiment of FIGURES 6–8. Accordingly, the voltages $A_1$ and $B_1$, which represent the algebraic summation of input voltages A and B respectively with the common mode negative feedback voltage C, will be present on the terminals 106 and 108 and are respectively applied to the base electrodes 190 and 192 of the transistors $T_1$ and $T_2$ of the DCMAC 90.

The base currents caused by the flow of loop currents through the ASN networks 102 and 104, cause collectors 194 and 196 of transistor $T_1$ and $T_2$ to draw current so as to generate an amplified, phase reversed replica (voltages $A_2$ and $B_2$) of the voltages $A_1$ and $B_1$. It should be noted at this point that the loop currents in the ASN networks 102 and 104 caused by the voltages A and B and common mode negative feedback voltage C, cause an algebraic summation of the voltages A and C ($A_1$), in ASN 102 and the voltages B and D ($B_1$), in ASN 104.

The reference voltage −V is coupled to the DCMAC 90 via the collector-emitter circuit of the emitter follower transistor $T_9$ for providing the necesary bias potentials for transistor $T_9$. The collector-emitter circuit of transistor $T_9$ comprises the negative supply voltage −V, terminal 209, collector 207, emitter 206, resistor 205 and the positive supply voltage +V. Since the emitter 206 of transistor $T_9$ is connected to the common emitters 202 and 204 of transistors $T_1$ and $T_2$, the reference common mode voltage, which is applied to the base 208 of transistor $T_9$ via terminal 211, is injected into the DCMAC 90. Accordingly, the emitter-base voltages of both transistors $T_1$ and $T_2$ are made up of the differential voltages $A_1$ and $B_1$ and the algebraic difference between the reference voltage and the common mode feedback voltage C. Thus, because the differential amplifier circuit has a high common mode forward gain characteristic and since a high common mode negative feedback feature is provided, the common mode voltage developed by the DCMAC 90 is reduced towards zero and tends to approach or "lock to" the reference voltage. The transistor $T_9$ is connected in the circuit so that its operating base-emitter bias offsets the operating bias of transistor $T_1$ and $T_2$.

It will be apparent, that the DCMAC 90 compares the common mode components of the voltages $A_1$ and $B_1$ with the reference voltage, which is applied to the transistors $T_1$ and $T_2$ through transistor $T_9$, for developing a common mode error voltage so as to compensate for the common mode voltage drifts of the overall circuit. That is to say, any common mode voltage drifts caused by circuit components or circuit operation, such as power supply or temperature variations, will be compensated for by the development of the common mode negative voltage at the output end of the circuit and the feedback of this voltage to the DCMAC 90 through the ASN networks 102 and 104 for comparison with the reference voltage. The comparison of the feedback and reference voltages in the DCMAC develops the common mode error voltage which dynamically compensates for the common mode voltage drifts of the overall circuit.

The voltages $A_2$ and $B_2$, which are developed by the DCMAC 90, are then delivered to the first stage of the cascaded DCDA stages via resistors 210 and 212 and terminals 91 and 93, respectively. The DCDA 92, the first differential amplifier stage, is provided for further differential and common mode amplification of the voltages $A_2$ and $B_2$. The signals $A_2'$ and $B_2'$ present on the terminals 237 and 239 will then be further amplified by succeeding stages of the DCDA, such as shown by DCDA 92'. It is to be understood, however, that although the cascaded stages of direct coupled differential amplifiers which make up the DCDA 92 are conventional, the number of stages, which may be none at all, must be such that the common mode closed loop path, as shown in FIGURE 6, has an overall negative gain. Accordingly, any well known method for providing the proper sense for the common mode feedback voltage C may be incorporated in this embodiment of the present invention without departing from the spirit and scope thereof.

The voltages $A_2''$ and $B_2''$, which are present on terminals 261 and 263 are then delivered to the emitter-followers $T_7$ and $T_8$, respectively. Since the emitter-followers inherently have unity gain characteristics, there will be no amplification of the voltages $A_2''$ and $B_2''$. The transistors $T_7$ and $T_8$ advantageously provide the required impedance coupling between the output circuit of DCDA 92' and the input circuit of CMF 98. The voltages $A_3$ and $B_3$ are therefore present at the overall output terminals 282 and 284, respectively.

The voltages $A_3$ and $B_3$, which are developed by the DCDA stages and the emitter-followers $T_7$ and $T_8$, are then respectively coupled to the CMF 98, which is designed to pass only the common mode voltage appearing on the terminals 282 and 284. The CMF 98 of this embodiment operates in substantially the same manner as the CMF 12 described above with regard to the operation of FIGURES 1–5. As mentioned above with regard to the operation of FIGURES 1–5, the desired filtering of the common mode voltage by the CMF 98 is perfected by applying the voltages $A_3$ and $B_3$ to resistors 288 and 290, respectively, of the CMF 98. Since one end each of the resistors 288 and 290 are connected in common and since these resistors are of equal value, the common mode components of voltages $A_3$ and $B_3$ cause loop currents to flow through the resistors 288 and 290 of CMF 98 in the same direction. However, the differential mode components of the voltages $A_3$ and $B_3$ cause loop currents to flow in opposite directions, with respect to each other, through the resistors 288 and 290 of CMF 98. Accordingly, the common mode components of voltages $A_3$ and $B_3$ will appear at terminal 100 whereas the differential mode components will be substantially cancelled out. Thus, the common mode feedback voltage C represents a highly amplified version of the common mode components of the voltages $A_2$ and $B_2$ and will be of proper sense so as to cause the common mode closed loop gain to be negative. For similar reasons as that mentioned above with regard to the operations of the embodiments of FIGURES 1–5 and 6, the capacitor 292, which is connected between terminal 100 and ground, is provided for shunting out any high frequency components superimposed on the voltages $A_3$ and $B_3$. The common mode negative feedback voltage C is then simultaneously applied to the ASN networks 101 and 104 where it is algebraically summed with the input voltages A and B, respectively, as described earlier.

Figure 10:
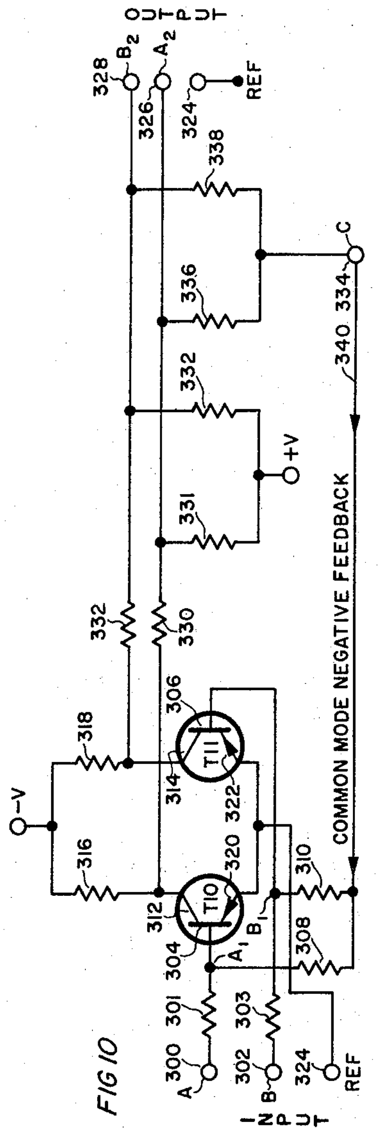
FIGURE 10 is a schematic representation of another embodiment of the present invention which shows a single stage differential amplifier utilizing transistors as active elements.

*Detailed description—FIGURE 10*

Referring now to FIGURE 10, there is shown a single stage embodiment of the present invention utilizing transistors as the active elements.

The differential input voltages A and B are respectively coupled to the base electrodes 304 and 306 of transistors $T_{10}$ and $T_{11}$ via terminals 300 and 302 and resistors 301 and 303, respectively. The base electrodes 304 and 306 are connected to terminal 334 via resistors 308 and 310, respectively. The collector electrodes 312 and 314 of transistors $T_{10}$ and $T_{11}$ are respectively connected to a negative supply voltage −V via resistors 316 and 318 while the emitter electrodes 320 and 322 of these transistors are connected in common to a reference voltage via terminal 324. The collector electrodes 312 and 314 of transistors are also connected to output terminals 326 and 328, respectively, via resistors 330 and 332, respectively. The output terminals 326 and 328 are also connected to a positive supply voltage +V via resistors 330 and 332, respectively, and to terminal 334 via resistors 336 and 338, respectively.

The resistors 301 and 308 function as an algebraic summation network (ASN) while the resistors 303 and 310 also function as a second algebraic summation network (ASN). The transistors $T_{10}$ and $T_{11}$ function in the circuit as a differential and common mode amplifier and comparator (DCMAC), whereas the resistors 336 and 338 function as a common mode filter (CMF). A mode of operation of the circuit of FIGURE 10 is described below.

*Mode of operation—FIGURE 10*

The operation of the differential amplifier circuit of FIGURE 10 is as follows:

When the input signals A and B are respectively applied to terminals 300 and 302, loop currents are caused to flow through resistors 301 and 308, which constitute a first ASN network, and resistors 303 and 310, which constitute a second ASN network. The common mode feedback voltage C, which is fed back to the ASN networks via conductor 340, also causes loop currents to flow through resistor 301 and 308 of the first ASN network and resistors 303 and 310 of the second ASN network. Voltages $A_1$ and $B_1$, which represent the algebraic summation of input voltages A and B respectively with the common mode negative feedback voltage C, are accordingly coupled to the base electrodes 304 and 306 of the transistors $T_{10}$ and $T_{11}$, respectively. Transistors $T_{10}$ and $T_{11}$ constitute a differential and common mode amplifier and comparator.

The base currents caused by the flow of loop curents through the first and second ASN networks, cause collectors 312 and 314 of transistor $T_{10}$ and $T_{11}$ to draw current so as to generate an amplified phase-reversed replica (voltages $A_2$ and $B_2$) of the voltages $A_1$ and $B_1$. As mentioned above with regard to the operation of the embodiment of FIGURE 9, the loop currents in the ASN network caused by the voltages A and B and the common mode negative feedback voltage C, cause an algebraic summation of the voltages A and C ($A_1$), which is applied to base 304 of transistor $T_{10}$, and algebraic summation of voltages B and C ($B_1$) which is applied to base 306 of transistor $T_{11}$.

The reference voltage is applied to the emitters 320 and 322 of the transistors $T_{10}$ and $T_{11}$ via terminal 302. Accordingly, the reference common mode voltage is injected into the emitter-collector circuits of transistors $T_{10}$ and $T_{11}$. It will be apparent that the emitter-base voltages of both transistors $T_{10}$ and $T_{11}$ are made up of differential voltages A and B and the algebraic differences between the reference voltage and the difference between the common mode negative feedback voltage C and the common mode component of input voltages A and B. This is in effect the common mode error voltage. As mentioned above, since the differential amplifier circuit has a high common mode forward gain characteristic and since a common mode negative feedback feature is provided, the common mode error voltage developed by transistors $T_{10}$ and $T_{11}$ is reduced towards zero thereby causing the common mode voltage C to approach or "lock to" the reference voltage. It will also be apparent that the transistors $T_{10}$ and $T_{11}$ of this single stage embodiment compares the common mode components of the voltage $A_1$ and $B_1$ with the reference voltage applied to the transistors $T_{10}$ and $T_{11}$ through terminal 324 for developing a common mode error voltage so as to compensate for the common mode voltage drifts of the overall circuit. Thus, the comparison of the feedback and reference voltages in the transistors $T_{10}$ and $T_{11}$ develops the common mode error voltage which dynamically compensates for any common mode voltage drifts caused by the circuit components or circuit operation, such as power supply or temperature variations, so as to compensate for any common mode voltage drifts of the overall circuit.

The voltages $A_2$ and $B_2$ are then coupled to terminals 326 and 328 via collectors 312 and 314 of transistors $T_{10}$ and $T_{11}$, and resistors 330 and 332, respectively. The voltages $A_2$ and $B_2$ are also coupled respectively to resistors 336 and 338, which resistors constiute a common mode filter (CMF). Since resistors 336 and 338 have one end of each connected in common and since these resistors are of equal values, the common mode components of the voltages $A_2$ and $B_2$ cause loop currents to flow through the resistors 336 and 338 in the same direction. However, the differential mode components of voltages $A_2$ and $B_2$ cause loop currents to flow in opposite directions, with respect to each other, through resistors 336 and 338. Accordingly, the common mode components of voltages $A_2$ and $B_2$ will appear at terminal 334 whereas the differential mode components will be substantially cancelled out. Thus, the common mode negative feedback voltage C represents an amplified version of the common mode components of voltages $A_2$ and $B_2$ and will be of proper sense to cause an overall negative gain in the common mode closed loop path of the differential amplifier circuit.

The common mode negative feedback voltage C is then simultaneously applied to resistors 308 and 310 of the first and second ASN networks respectively, wheer it is algebraically summed with the input voltages A and B, respectively, as described earlier.

It will be apparent from the foregoing description of the several exemplary embodiments and modes of operation of the present invention that the development and utilization of a highly amplified common mode negative feedback voltage uniquely stabilizes overall differential mode voltage amplification, with respect to the common mode voltage, and provides low common mode voltage drift. Further, the additional expedient of utilizing a reference voltage at both the input and output circuits of the differential amplifier circuit and as a common reference for the inputs of the comparator section of the differential amplifier circuit, provides an amplified differential voltage which is substantially "locked to" the reference voltage. Still further, the use, in several of the exemplary embodiments, of a stage in the circuit which functions both as a differential and common mode amplifier and as a comparator advantageously reduces the circuitry external to the differential amplifier circuit and provides a dual-function feature which desirably reduces the number of circuit components required.

It is thus further seen that the balanced differential amplifier circuits of the present invention are simple in construction, economical to manufacture, and highly efficient in achieving the desired objects and performing the intended functions.

While several embodiments of the present invention have been described in detail, it is to be understood that other modifications are contemplated which would be apparent to persons skilled in the art without departing from the spirit of the invention or the scope of the appended claims.

I claim:

1. A differential amplifier circuit for compensating for the presence of unwanted common mode voltages in said circuit, comprising a differential amplifier having a pair of inputs for receiving differential input voltages, and a pair of outputs for supplying a voltage proportional to the difference of said input voltages, means connected to said output terminals for removing therefrom the common mode voltage present in said output voltage and for generating from said common mode voltage a feedback voltage, means for comparing said feedback voltage with a predetermined voltage level so as to develop a common mode error voltage, which is negative with respect to said unwanted common mode voltages in said circuit, and means for applying said error voltage to said differential amplifier so as to effectively cancel said unwanted common mode voltages in said circuit.

2. A differential amplifier circuit having means for compensating for the presence of unwanted common mode voltages in said circuit so as to provide a stabilized differential mode voltage amplification of two differential input voltages, said differential amplifier circuit comprising a differential amplifier having a pair of inputs for receiving said differential input voltages, and a pair of outputs for supplying output voltages which are a balanced amplified version of said differential input voltages, filter means in said output circuit for removing the common mode voltage from said output voltages, said filter means having an output at which said common mode voltage appears, comparing means coupled to said filter means for comparing said common mode voltage with a reference voltage, so as to develop a common mode error voltage, and means for applying said error voltage to said differential amplifier so as to effectively cancel said unwanted common mode voltages in said circuit and thereby enabling said circuit to supply a stabilized differential mode voltage amplification of said two differential input voltages.

3. A differential amplifier circuit in accordance with claim 2 wherein said differential amplifier further includes said comparing means as a part thereof so that said differential amplifier provides the dual function of differential amplification of said input voltages applied to said circuit and comparison of said common mode voltage with said reference voltage, and said reference voltage being coupled in common to said inputs of said differential amplifier.

4. A differential amplifier circuit for providing a stabilized differential mode voltage amplification of two differential input voltages, said circuit having low common mode voltage drift characteristics, comprising:

(a) a differential amplifier for amplifying the differential and common mode voltages of two differential voltages;

(b) a common mode filter connected to said differential amplifier for passing the common mode voltage only of said two voltages which are amplified by said differential amplifier so as to develop a common mode feedback voltage;

(c) a comparator connected to said common mode filter for comparing said feedback voltage with a reference voltage so as to develop a common mode error voltage which is negative with respect to the overall common mode voltage of said differential amplifier circuit; and (d) a network connected to said differential amplifier and said comparator for algebraically summing said two differential input voltages respectively with said error voltage so as to develop two summation voltages and for coupling said summation voltages to said differential amplifier for amplification.

5. A differential amplifier circuit for providing stabilized differential mode voltage amplification of two differential input voltages and low common mode voltage drift characteristics, said circuit having two inputs and two outputs, comprising:

(a) a differential amplifier for amplifying the differential and common mode voltages of two differential voltages;

(b) said differential amplifier having two inputs and two outputs;

(c) a common mode filter for passing the common mode voltage only of two differential voltages;

(d) said filter having two inputs and an output;

(e) said two outputs of said differential amplifier being connected to said outputs of said differential amplifier circuit and to said inputs of said filter for coupling said voltages which are amplified by said differential amplifier to said filter so as to develop a common mode feedback voltage;

(f) a comparator for comparing a voltage with a reference voltage;

(g) said comparator having an input and output;

(h) said output of said filter being connected to said input of said comparator for coupling said common mode feedback voltage to said comparator so as to develop a common mode error voltage which is negative with respect to the overall common mode voltage of said differential amplifier circuit;

(i) a pair of networks for algebraically summing two voltages;

(j) each said network having two inputs and one output;

(k) each said input of said differential amplifier circuit being connected to one of said inputs of each said network for coupling said differential input voltages to said networks;

(l) said output of said comparator being connected to the other input of each said network for coupling said error voltage to said networks;

(m) said network being adapted to algebraically sum said two differential input voltages respectively with said error voltage so as to provide two summation voltages; and (n) said output of said networks being connected to said input of said differential amplifier for coupling said summation voltages to said differential amplifier.

6. A differential amplifier in accordance with claim 5 wherein:

(a) said differential amplifier comprises two vacuum tubes each having at least an anode, a cathode and a control electrode;

(b) said anodes of said differential amplifier being respectively connected to a positive supply voltage through anode load resistors and respectively connected to a negative supply voltage through a pair of series connected biasing resistors;

(c) said cathodes of said differential amplifier being connected in common to ground;

(d) said summation voltages being respectively coupled to said control electrodes of said differential amplifier, and (e) said voltages which are amplified by said differential amplifier being respectively coupled from the junction of said biasing resistors to said inputs of said common mode filter.

7. A differential amplifier in accordance with claim 6 wherein:

(a) said common mode filter comprises at least two filter resistors each having one of their ends respectively connected to the junction of said biasing resistors and their other ends connected in common; and (b) said feedback voltage which is developed by said filter being coupled from the common ends of said filter resistors to said input circuit of said comparator.

8. A differential amplifier in accordance with claim 7 wherein:

(a) said comparator comprises a vacuum tube having at least an anode, a cathode and a control electrode;

(b) said anode of said comparator being connected to said positive supply voltage through an anode load resistor;

(c) said cathode of said comparator being connected to a reference voltage through an unbypassed biasing resistor;

(d) said feedback voltage which is developed by said filter being coupled to said control electrode of said comparator; and (e) said error voltage which is developed by said comparator being coupled from said anode of said comparator to each said network.

9. A differential amplifier in accordance with claim 8 wherein:

(a) said pair of networks comprises a pair of series connected summation resistors with one end of each of said pairs being respectively connected to said input circuit of said differential amplifier circuit and the other end of each of said pairs being connected in common to said anode of said comparator; and (b) a common mode filter connected to said differensaid pair of networks being respectively coupled from the junction of said summation resistors to said control electrodes of said differential amplifier.

10. A differential amplifier circuit for providing a stabilized differential mode voltage amplification of two differential input voltages, said circuit having low common mode voltage drift characteristics comprising:

(a) a differential amplifier for amplifying the differential and common mode voltages of two differential voltages;

(b) a common mode filter connected to said differential amplifier for passing the common mode voltage only present in said two voltages which are amplified by said differential amplifier so as to develop a common mode negative feedback voltage;

(c) a network connected to said differential amplifier and to said filter for algebraically summing said two differential input voltages respectively with said feedback voltage so as to develop two summation voltages and for coupling said summation voltages from said network to said differential amplifier; and (d) said differential amplifier comprising means for comparing said summation voltages with a reference voltage so as to develop a common mode error voltage which is negative with respect to the overall common mode voltage of said differential amplifier circuit whereby said common mode voltage drift of said differential amplifier circuit is caused to approach zero.

References Cited

UNITED STATES PATENTS

| | | | |
|---|---|---|---|
| 2,896,031 | 7/1959 | Young | 330—71 X |
| 2,965,767 | 12/1960 | Wanlass | 307—88.5 |
| 3,042,876 | 7/1962 | Pegram. | |
| 3,089,097 | 5/1963 | Bell | 330—16 X |
| 3,146,416 | 8/1964 | Bobon et al. | 307—88.5 |
| 3,168,708 | 2/1965 | Stuart-Williams et al. | 330—30 |

ROY LAKE, *Primary Examiner.*

NATHAN KAUFMAN, *Examiner.*